(12) United States Patent
Chen et al.

(10) Patent No.: US 8,624,326 B2
(45) Date of Patent: Jan. 7, 2014

(54) FINFET DEVICE AND METHOD OF MANUFACTURING SAME

(75) Inventors: Chi-Ming Chen, Zhubei (TW); Chung-Yi Yu, Hsinchu (TW); Ho-Yung David Hwang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 218 days.

(21) Appl. No.: 13/277,669

(22) Filed: Oct. 20, 2011

(65) Prior Publication Data

US 2013/0099282 A1    Apr. 25, 2013

(51) Int. Cl.
*H01L 21/70*    (2006.01)

(52) U.S. Cl.
USPC .................. 257/369; 438/216; 257/E29.255; 257/E27.062; 257/E21.628

(58) Field of Classification Search
USPC .................. 257/368–369, E21.409, E29.255, 257/E27.062; 438/269
See application file for complete search history.

(56) References Cited

U.S. PATENT DOCUMENTS

2008/0073667 A1*  3/2008  Lochtefeld .................. 257/190
2011/0068407 A1   3/2011  Yeh et al.

OTHER PUBLICATIONS

J.-S. Park, et al., "Defect Reduction of Selective Ge Epitaxy in Trenches on Si(001) Substrates Using Aspect Ratio Trapping," Applied Physics Letters 90, 052113, 2007, 3 pages, American Institute of Physics.

* cited by examiner

*Primary Examiner* — Julio J Maldonado
*Assistant Examiner* — Sonya D McCall Shepard
(74) *Attorney, Agent, or Firm* — Haynes and Boone, LLP

(57) ABSTRACT

A semiconductor device and method for fabricating a semiconductor device is disclosed. An exemplary semiconductor device includes a substrate including a first dielectric layer disposed over the substrate. The semiconductor device further includes a buffer layer disposed over the substrate and between first and second walls of a trench of the dielectric layer. The semiconductor device further includes an insulator layer disposed over the buffer layer and between the first and second wall of the trench of the dielectric layer. The semiconductor device also includes a second dielectric layer disposed over the first dielectric layer and the insulator layer. Further, the semiconductor device includes a fin structure disposed over the insulator layer and between first and second walls of a trench of the second dielectric layer.

20 Claims, 12 Drawing Sheets

FINFET DEVICE AND METHOD OF MANUFACTURING SAME

BACKGROUND

The semiconductor integrated circuit (IC) industry has experienced rapid growth. In the course of the IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as the semiconductor industry has progressed into nanometer technology process nodes in pursuit of higher device density, higher performance, and lower costs, challenges from both fabrication and design have resulted in the development of fin-like field effect transistor (FinFET) devices. Although existing FinFET devices and methods of fabricating FinFET devices have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
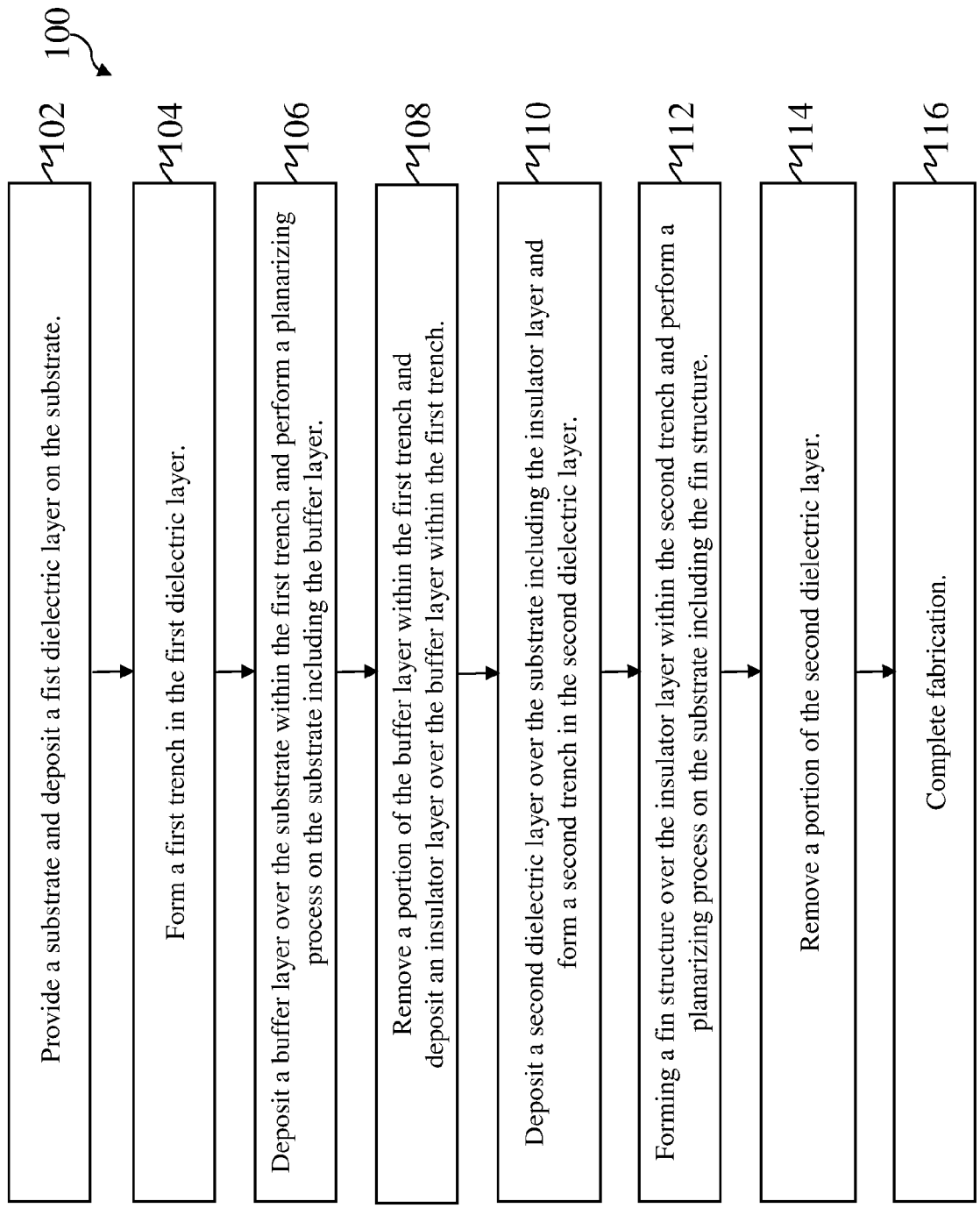
FIG. 1 is a flowchart illustrating a method of fabricating a semiconductor device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Also, the components disclosed herein may be arranged, combined, or configured in ways different from the exemplary embodiments shown herein without departing from the scope of the present disclosure. It is understood that those skilled in the art will be able to devise various equivalents that, although not explicitly described herein, embody the principles of the present invention.

Examples of devices that can benefit from one or more embodiments of the present invention are semiconductor devices. Such a device, for example, is a fin-like field effect transistor (FinFET). The FinFET device, for example, may be a P-type metal-oxide-semiconductor (PMOS) FinFET device, a N-type metal-oxide-semiconductor (NMOS) FinFET device, or a complementary metal-oxide-semiconductor (CMOS) FinFET device including a PMOS FinFET device and a NMOS FinFET device. The following disclosure will continue with a FinFET example to illustrate various embodiments of the present invention. It is understood, however, that the invention should not be limited to a particular type of device, except as specifically claimed.

With reference to FIGS. 1 and 2-12, a method 100 and a semiconductor device 200 are collectively described below. FIG. 1 is a flow chart of a method 100 for fabricating an integrated circuit device/semiconductor device according to various aspects of the present disclosure. In the present embodiment, the method 100 is for fabricating a semiconductor device that includes a fin-like field effect transistor (FinFET) device.

The method 100 begins at block 102 where a substrate is provided and a first dielectric layer is deposited on the substrate. At block 104, a first trench is formed in the first dielectric layer. The formation of the first trench may include patterning a mask layer and etching the first dielectric layer using the mask layer such that a surface of the substrate is exposed. At block 106, a buffer layer is deposited over the exposed surface of the substrate within the first trench and perform a planarizing process on the substrate including the buffer layer. The buffer layer may be deposited such that it substantially fills the first trench. The buffer layer may be deposited by epitaxially (epi) growing the buffer layer within the first trench. The planarizing process may be performed such that excess material of the buffer layer is removed. The method continues with block 108 where a portion of the buffer layer is removed within the first trench and an insulator layer is deposited over the buffer layer within the first trench. Removing the portion of the buffer layer may include recessing back the buffer layer by an etching process. Depositing the insulator layer may include epi growing the insulator layer over the buffer layer within the first trench. At block 110, a second dielectric layer is deposited over the substrate including the insulator layer and a second trench is formed in the second dielectric layer. The formation of the second trench may include patterning a mask layer and etching the second dielectric layer using the mask layer such that a surface of the insulator layer is exposed. At block 112, a fin structure is formed by depositing a semiconductor material over the insulator layer within the second trench and perform a planarizing process on the substrate including the fin structure. Forming the fin structure may include epi growing the semiconductor material over the insulator layer within the second trench such that the semiconductor material substantially fills the second trench. The planarizing process may be performed such that excess material of the semiconductor material of the fin structure is removed. The method continues with block 114 where a portion of the second dielectric layer is removed. Removing the second dielectric layer may include an etching process such that the sidewalls of the fin structure are exposed. The method 100 continues with block 116 where fabrication of the integrated circuit device is completed.

Completing the fabrication process may include, among other things, forming a gate stack over a channel region of the fin structure and forming source and drain (S/D) feature in a S/D region of the semiconductor device. Forming the gate stack may be a gate first or a gate last process. For example, in a gate first process, forming the gate stack may include depositing a dielectric layer over the fin structure in the central region, forming a gate structure (e.g., gate electrode) over the dielectric layer, and forming gate spacers on the walls of the gate structure and adjacent to the S/D region of the semiconductor device. Thereafter, a S/D feature may be formed in the S/D region by recessing the semiconductor material in the S/D region and depositing a doped semiconductor material in the S/D region. The deposition of the doped semiconductor material may include epi growing the semiconductor material. Additional steps can be provided before, during, and after the method 100, and some of the steps described can be replaced or eliminated for other embodiments of the method. The discussion that follows illustrates various embodiments of a semiconductor device that can be fabricated according to the method 100 of FIG. 1.

FIGS. 2-11 illustrate diagrammatic cross-sectional side views of one embodiment of a semiconductor device at various stages of fabrication, according to the method of FIG. 1. Additionally, FIG. 12 illustrates a perspective view of one embodiment of the semiconductor device of FIGS. 2-11, at a later stage of fabrication, according to the method of FIG. 1. As noted above, in the present disclosure, the semiconductor device is a FinFET device. The FinFET device includes any fin-based, multi-gate transistor. The FinFET device 200 may be included in a microprocessor, memory cell, and/or other integrated circuit device. FIGS. 2-12 have been simplified for the sake of clarity to better understand the inventive concepts of the present disclosure. Additional features can be added in the FinFET device 200, and some of the features described below can be replaced or eliminated in other embodiments of the semiconductor device 200.

Figure 2:
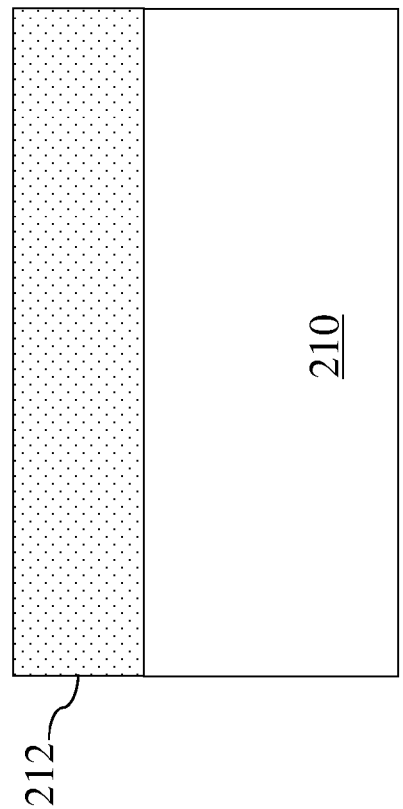
FIGS. 2-11 illustrate diagrammatic cross-sectional side views of one embodiment of a semiconductor device at various stages of fabrication, according to the method of FIG. 1.

Referring to FIG. 2, the FinFET device 200 includes a substrate (e.g., wafer) 210. The substrate 210 is a bulk substrate that includes, for example, silicon, silicon germanium, and/or germanium, or any other suitable material. Alternatively, the substrate 210 comprises an elementary semiconductor; a compound semiconductor, such as silicon carbide, gallium arsenic, gallium phosphide, indium phosphide, indium arsenide, and/or indium antimonide; or combinations thereof. Alternatively, the substrate 210 includes a silicon-on-insulator (SOI) substrate. The SOI substrate can be fabricated using separation by implantation of oxygen (SIMOX), wafer bonding, and/or other suitable methods. The substrate 210 may include various doped regions and other suitable features. In the above alternative embodiments, the substrate 210 may further include epitaxial (epi) silicon, epitaxial (epi) germanium, and/or epitaxial (epi) silicon germanium.

With further reference to FIG. 2, deposited over the substrate 210 is a first dielectric layer 212. The first dielectric layer 212 is formed by any suitable process to any suitable thickness. In the present embodiment, the first dielectric layer 212 includes silicon oxide and is formed by a CVD or a thermal oxidation process to a thickness from about 3,000 Angstroms to about 5,000 Angstroms. Alternatively, the first dielectric layer 212 includes a dielectric material such as high-k dielectric material, other suitable dielectric material, or combinations thereof. In certain embodiments, the first dielectric layer 212 is formed to a thickness from about 2,000 Angstroms to about 10,000 Angstroms. Examples of high-k dielectric material include $HfO_2$, HfSiO, HfSiON, HfTaO, HfTiO, HfZrO, zirconium oxide, aluminum oxide, hafnium dioxide-alumina ($HfO_2$-$Al_2O_3$) alloy, other suitable high-k dielectric materials, and/or combinations thereof. The thermal oxidation process may be a dry or a wet process. In various examples, the silicon oxide can be formed by physical vapor deposition (PVD), atomic layer deposition (ALD), high density plasma CVD (HDPCVD), other suitable methods, and/or combinations thereof. The CVD process, for example, may use chemicals including Hexachlorodisilane (HCD or $Si_2Cl_6$), Dichlorosilane (DCS or $SiH_2Cl_2$), Bis(TertiaryButylAmino)Silane (BTBAS or $C_8H_{22}N_2Si$) and Disilane (DS or $Si_2H_6$).

Figure 3:
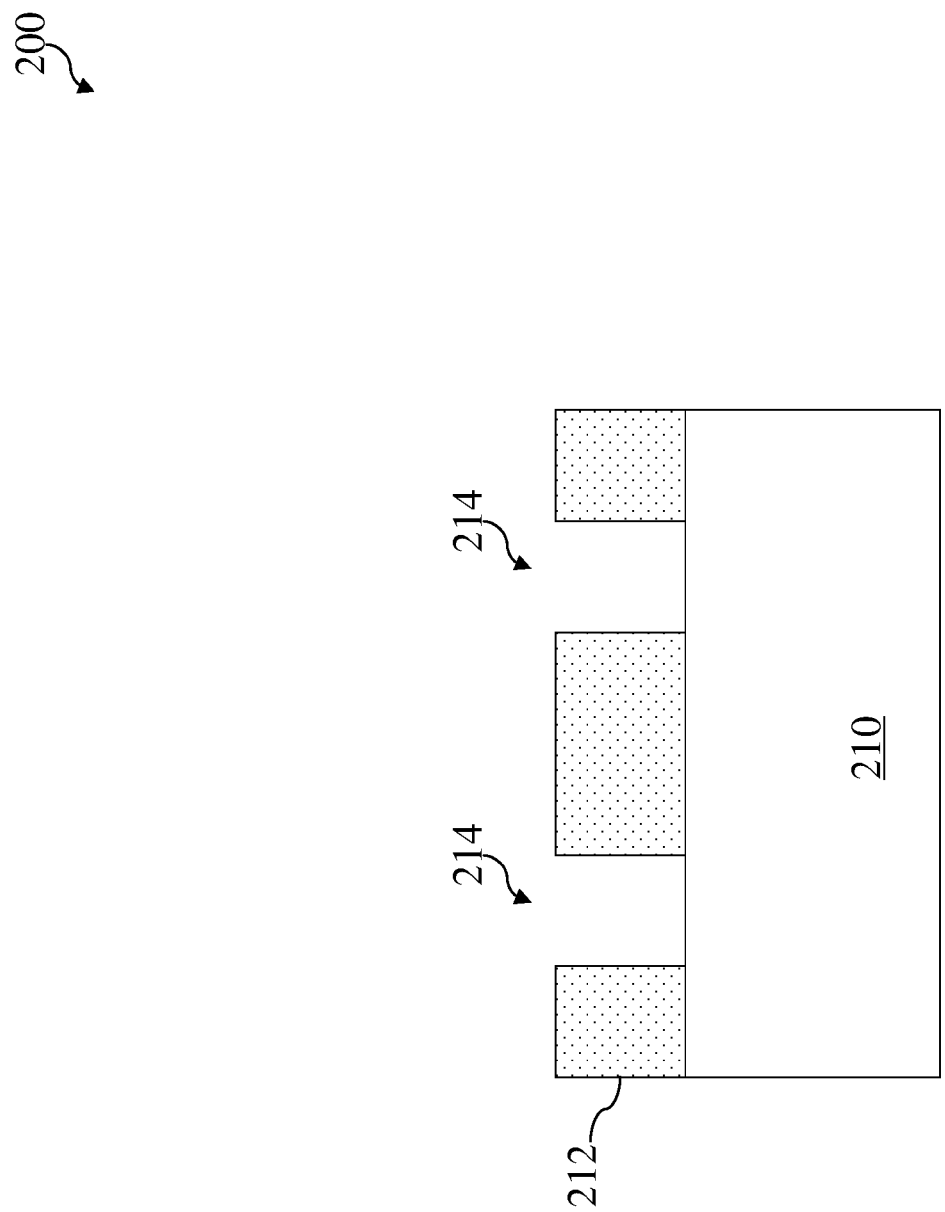

Referring to FIG. 3, a first trench 214 is formed in the first dielectric layer 212. In the present embodiment, the first trench 214 is formed by an etching process such that a surface of the substrate 210 is exposed. The etching process may include a wet etching, a dry etching process, or a combination thereof. In one example, a dry etching process may include forming a photoresist layer, patterning the photoresist layer, etching the first dielectric layer 212, and removing the photoresist layer. In furtherance of the example, the dry etching process used to etch the first dielectric layer 212 may include a chemistry including fluorine-containing gas. In furtherance of the example, the chemistry of the dry etch includes $CF_4$, $SF_6$, or $NF_3$.

Figure 4:
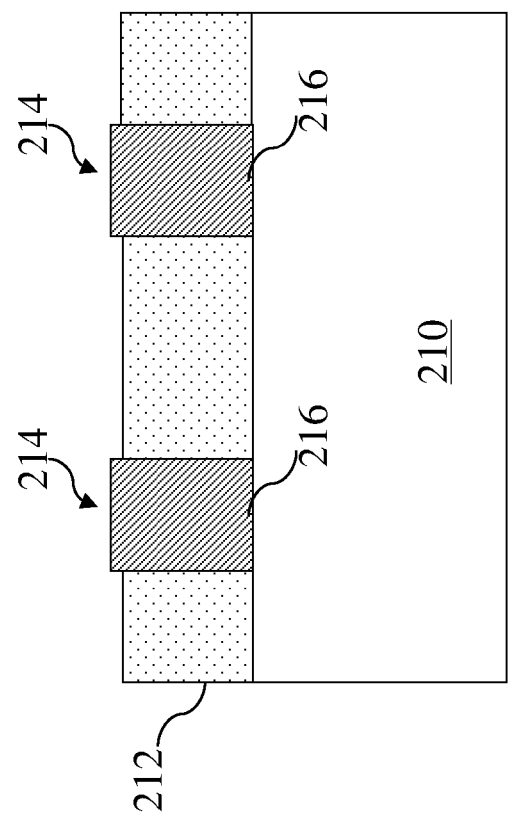

Referring to FIG. 4, a buffer layer 216 is deposited over the exposed surface of the substrate 210 within the first trench 214. In the present embodiment, depositing the buffer layer 216 includes a aspect ratio trapping (ART) method. The ART method includes epitaxially (epi) growing a buffer layer 216 such that it substantially fills the first trench 214 (e.g., epi growing the buffer layer 216 to a thickness of at least 3,000 Angstroms). The ART method traps defects arising from lattice mismatch (e.g., mismatch between the lattice of the substrate 210 and the buffer layer 216) by laterally confining sidewalls of the buffer layer 216 within the first trench 214, during the growing process. In other words, defects (e.g., dislocations) originating at the interface of the substrate 210 and the buffer layer 216 are trapped. As such, defects (e.g., dislocations) in the upper portion of the buffer layer 216 are minimized or eliminated. Minimizing defects in the buffer layer 216 is desirable because as defects are minimized substrate loss is also minimized.

The buffer layer material is chosen such that defects arising from lattice mismatch are eliminated as the buffer layer 216 grows. The buffer layer 216 can be either a dielectric material, high/low band material, or a conductive material. In the present embodiment, the buffer layer 216 includes a type III/V material having a crystal structure, for example, the buffer layer 216 includes a material selected from the group consisting of AlAs, AlAs/Ge, InP, In(Ga)As, InAs, and InSb. Alternatively, the buffer layer 216 includes any suitable material that has a lattice constant that is close enough to the lattice constant of the substrate 210 such that as the buffer layer 216 epi grows, no defects (e.g., dislocations) are present toward the upper portion of the buffer layer 216.

Figure 5:
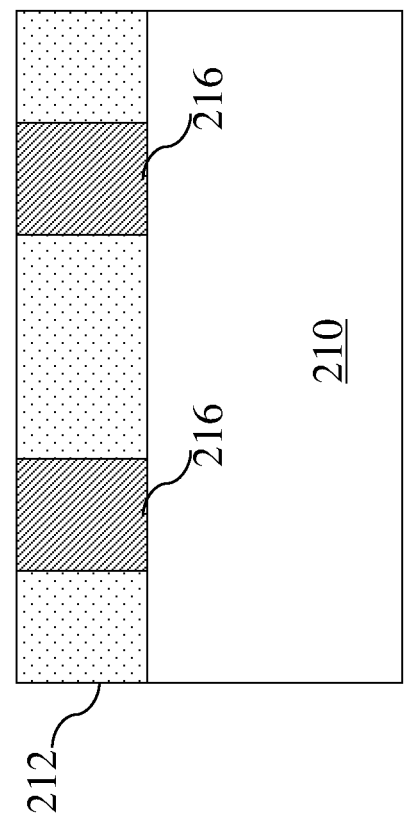

Referring to FIG. 5, a planarizing process is performed on the substrate 210 including the buffer layer 216. In the present embodiment, the planarizing process includes a chemical mechanical polishing (CMP) process applied to the FinFET device 200 to remove excessive portions of buffer layer 216. The planarizing process may be performed such that a top surface of the buffer layer 216 is in a plane with a top surface of the first buffer layer 212.

Figure 6:
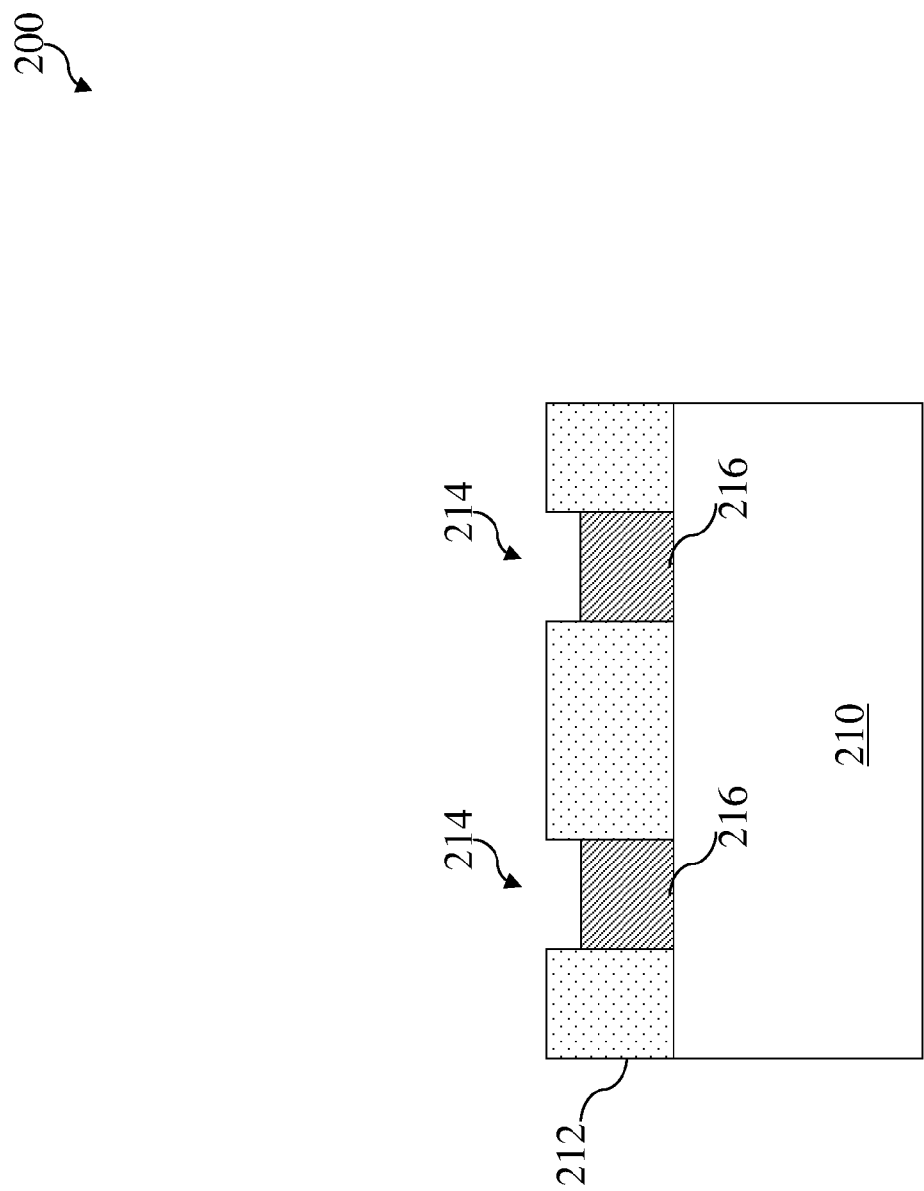

Referring to FIG. 6, the buffer layer 216 is recessed within the first trench 214. In the present embodiment, recessing the buffer layer 216 includes removing a portion of the buffer layer 216 by a wet etching process that etches back excessive buffer layer 216 material in the first trench 214 of the FinFET device 200, thus exposing a portion of the sidewalls of the trench 214. The buffer layer 216, for example, is etched back from about 500 Angstroms to about 2,000 Angstroms. The wet etching process may include a chemistry including HCl, Cl2, or any suitable chemistry appropriate for the buffer layer 216 material. Alternatively, the etching process may include a dry etching process, or a combination of wet and dry etching processes. In one example, a dry etching process may include forming a photoresist layer, patterning the photoresist layer, etching the buffer layer 216, and removing the photoresist layer.

Figure 7:
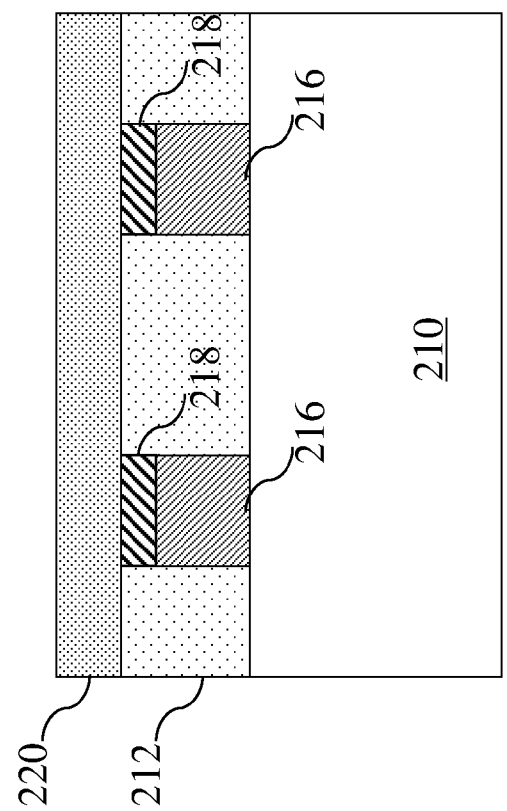

Referring to FIG. 7, an insulator layer 218 is deposited over the buffer layer 216 within the first trench 214 of FIG. 6. The insulator layer 218 may be deposited within the same chamber or by the same machine used to perform the processes of FIG. 6 above. The insulator layer 218 may be deposited by any suitable process to any suitable thickness. For example, depositing the insulator layer 218 includes epitaxially (epi) growing the insulator layer 218 in the first trench 214 of FIG. 6. In the present embodiment, the insulator layer 218 is deposited to a thickness greater than about 500 Angstroms such the first trench 214 of FIG. 6 is substantially filled. Alternatively, as long as the insulator layer 218 can function as an isolation structure, the insulator layer 218 is deposited such that the first trench 214 of FIG. 6 is not substantially filled. In the present embodiment, the insulator layer 218 includes a high band gap III/V material having a crystal structure, for example, the insulator layer 218 includes a material selected from the group consisting of AlAsSb, GaAsSb, and InAlAs. Alternatively, the insulator layer 218 includes any suitable dielectric material that can function as an isolation material. The insulator layer 218 may be chosen such that the lattice constant of the buffer layer 216 is substantially similar to the lattice constant of the insulator layer 218, thereby providing substantially dislocation free deposition of the insulator layer 218 on the buffer layer 216. Also, because the top surface and/or interface of the buffer layer 216, underlying the insulator layer 218, is substantially defect free (e.g., few or no dislocations), the deposition process used to form the insulator layer 218 provides for an insulator layer 218 that includes few or no defects (e.g., dislocations). Because the insulator layer 218 includes few or no defects, the top surface and/or interface of the insulator layer 218 is substantially defect free, thereby reducing or even eliminating substrate losses through the insulator layer 218 and the buffer layer 216.

Still referring to FIG. 7, a second dielectric layer 220 is deposited over the substrate 210 including the insulator layer 218. The second dielectric layer 220 may be deposited by any suitable process to any suitable thickness. The thickness of the dielectric layer 220 defines the height of a fin structure that is subsequently formed. In the present embodiment, the second dielectric layer 220 includes silicon oxide and is formed by a CVD process to a thickness from about 1,000 Angstroms to about 3,000 Angstroms. Alternatively, the second dielectric layer 220 includes a dielectric material such as high-k dielectric material, other suitable dielectric material, or combinations thereof. Examples of high-k dielectric material include HfO2, HfSiO, HfSiON, HfTaO, HfTiO, HfZrO, zirconium oxide, aluminum oxide, hafnium dioxide-alumina (HfO2-Al2O3) alloy, other suitable high-k dielectric materials, and/or combinations thereof. In various examples, the silicon oxide can be formed by physical vapor deposition (PVD), atomic layer deposition (ALD), high density plasma CVD (HDPCVD), other suitable methods, and/or combinations thereof. The CVD process, for example, may use chemicals including Hexachlorodisilane (HCD or Si2Cl6), Dichlorosilane (DCS or SiH2Cl2), Bis(TertiaryButylAmino)Silane (BTBAS or C8H22N2Si) and Disilane (DS or Si2H6).

Figure 8:
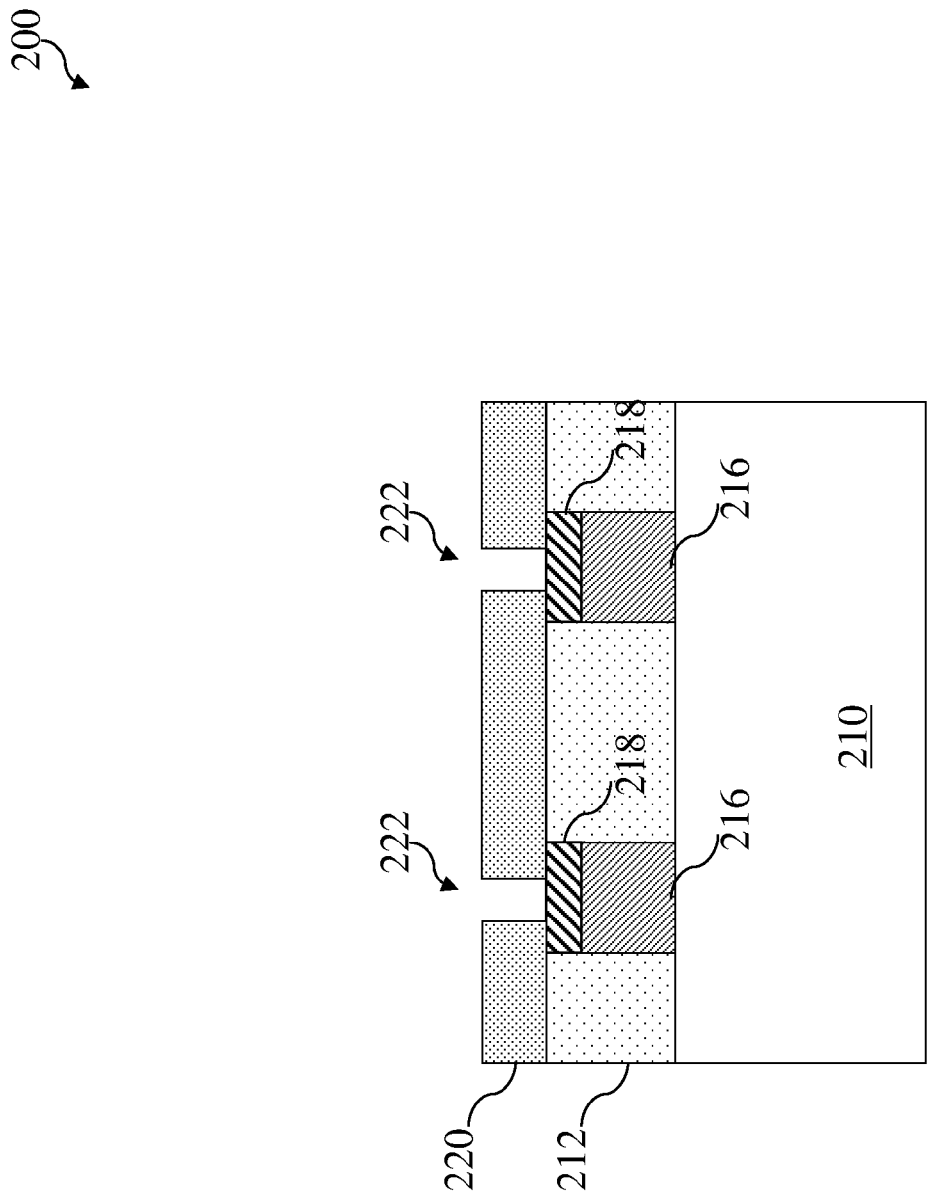

Referring to FIG. 8, a second trench 222 is formed in the second dielectric layer 220. In the present embodiment, the second trench 222 is formed by an etching process such that a surface of the insulator layer 218 is exposed (e.g., etching away a thickness of at least about 1,000 Angstroms of the second dielectric layer 220). The etching process includes a multiple step etching combination process including a wet etching and a dry etching process. For example, the multiple step etching process includes first performing a dry etching process to substantially remove the second dielectric layer 220 material within the second trench 222, and second performing a wet etching process to remove the remaining second dielectric layer 220 material within the trench and stopping on the insulator layer 218, thereby exposing a surface of the insulator layer 218. In further examples, the multiple step etching process includes performing additional sequences of dry and/or wet etching process. Alternatively the multiple step etching process includes first performing the wet etching process and second performing the dry etching process. The alternative embodiment further includes performing additional dry and/or wet etching processes. Alternatively, the etching process includes performing only a wet etching process or performing only a dry etching process. In one example, a wet etching process may include a chemistry including HCl, Cl2, or any suitable chemistry appropriate for the second dielectric layer 220 material. In one example, a dry etching process may include forming a photoresist layer, patterning the photoresist layer, etching the second dielectric layer 220, and removing the photoresist layer. In furtherance of the example, the dry etching process used to etch the second dielectric layer 220 may include a chemistry including fluorine-containing gas. In furtherance of the example, the chemistry of the dry etch includes CF4, SF6, or NF3.

Figure 9:
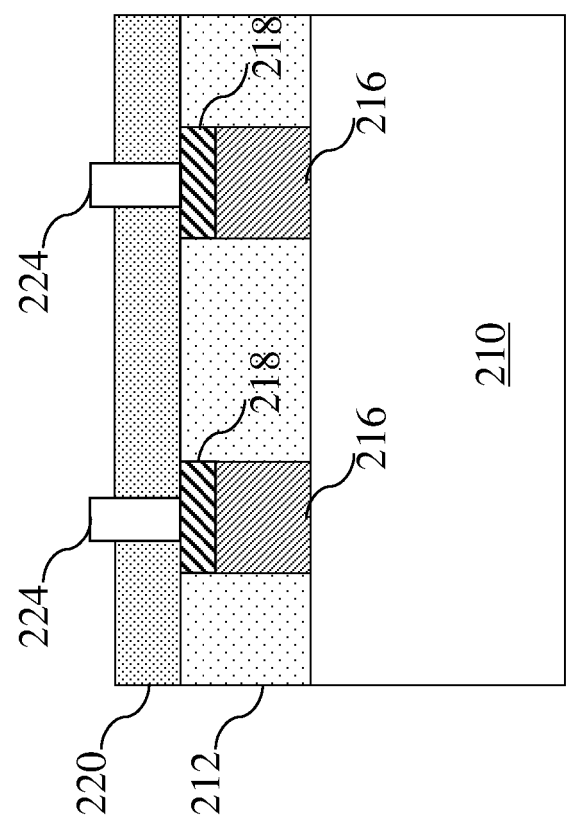

Referring to FIG. 9, a fin structure 224 of the FinFET device 200 is formed. Forming the fin structure 224 includes depositing a material, over the exposed surface of the insulator layer 218, within the second trench 222 (see FIG. 8). In the present embodiment, depositing the buffer layer 216 includes epitaxially (epi) growing a semiconductor material such that it substantially fills the second trench 222 (e.g., epi growing the semiconductor material to a thickness of at least about 1,000 Angstroms). The epitaxy process may include CVD deposition techniques (e.g., vapor-phase epitaxy (VPE) and/or ultra-high vacuum CVD (UHV-CVD)), molecular beam epitaxy, and/or other suitable processes. In the present embodiment, the semiconductor material of the fin structure 224 includes a type III/V material such as InAs, InGaAs, InGaSb, InP, AlSb, and the like. Alternatively, the fin structure includes Ge or any other suitable semiconductor material.

Figure 10:
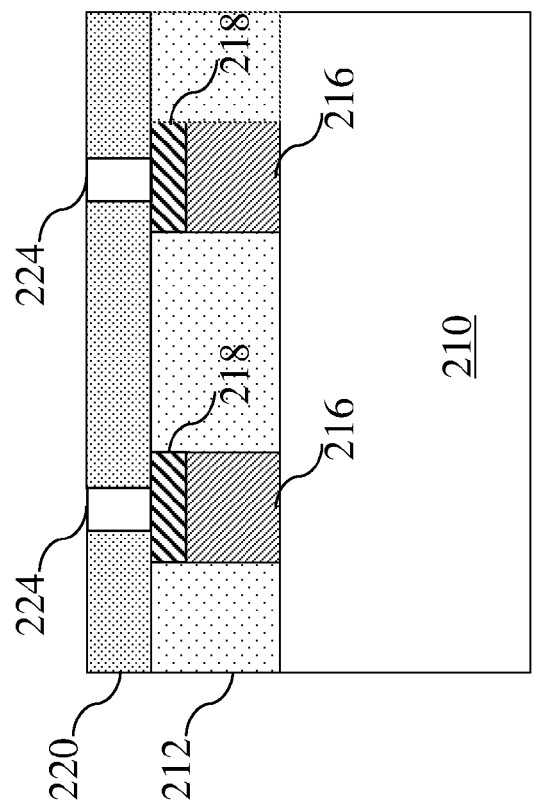

Referring to FIG. 10, a planarizing process is performed on the FinFET device 200 including the fin structure 224. In the present embodiment, the planarizing process includes a chemical mechanical polishing (CMP) process applied to the FinFET device 200 to remove excessive portions of the fin structure 224 material. The planarizing process may be performed such that a top surface of the fin structure 224 is in the same plane as a top surface of the second dielectric layer 220.

Figure 11:
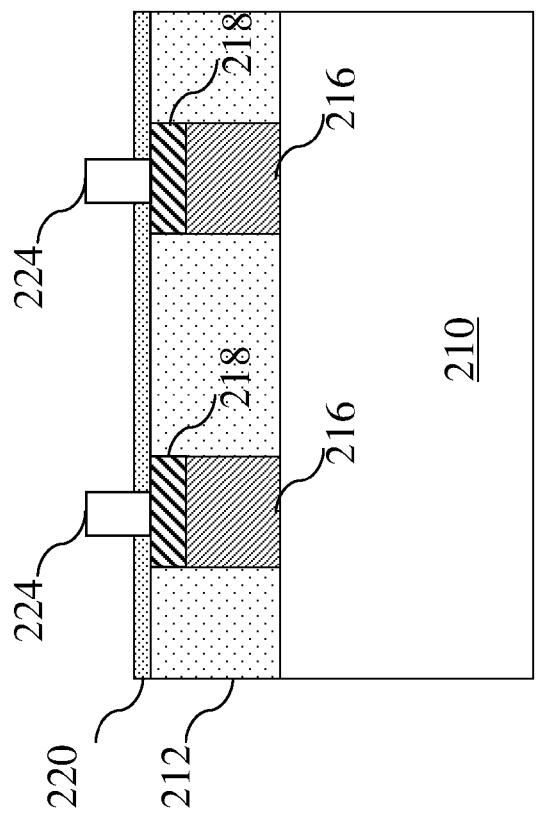
Figure 12:
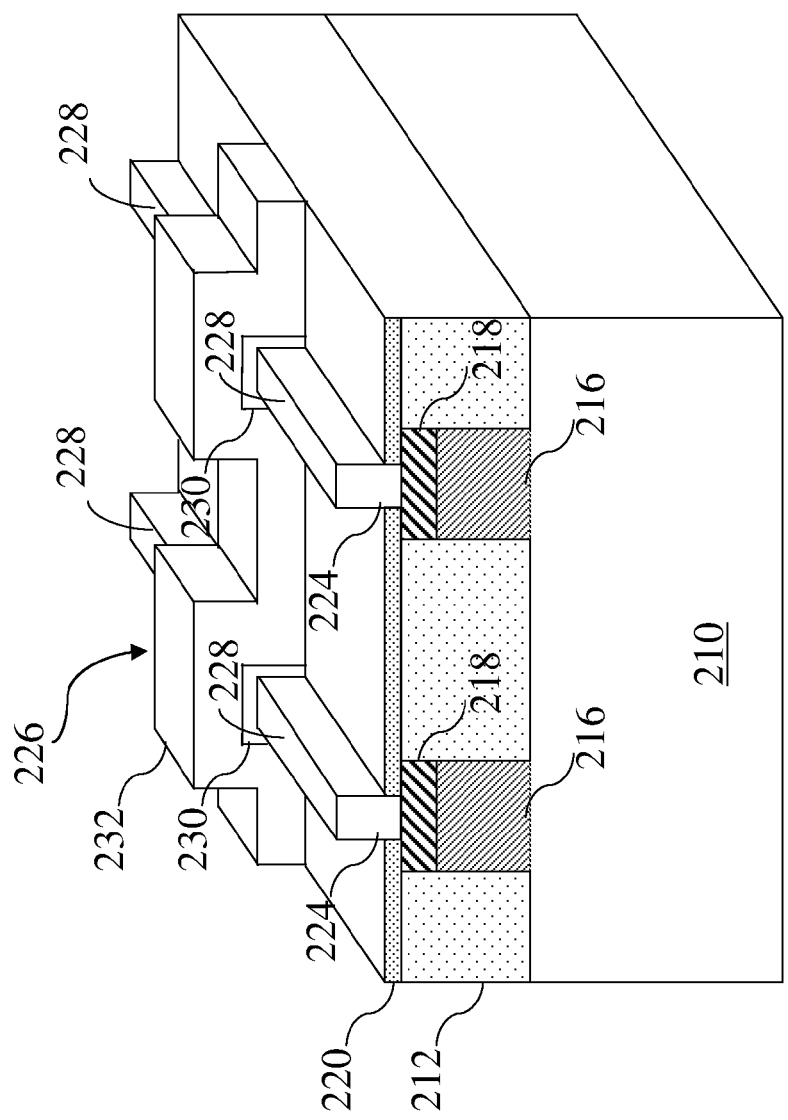
FIG. 12 illustrates a perspective view of one embodiment of the semiconductor device of FIGS. 2-11, at a later stage of fabrication, according to the method of FIG. 1.

Referring to FIG. 11, the second dielectric layer 220 is recessed to expose sidewalls of the fin structure 224. In the present embodiment, recessing the second dielectric layer 220 may include a photolithography and etching process that etches back excessive second dielectric layer 220 of the FinFET device 200, thus exposing a portion of the sidewalls of the fin structure 224. The second dielectric layer 220, for example, is etched back at least about 100 Angstroms. Alternatively, the second dielectric layer 220 is etched back from about 100 Angstroms to about 2600 Angstroms. Alternatively, recessing the second dielectric layer 220 includes removing any suitable thickness of the second dielectric layer 220, such that sidewalls of the fin structure 224 are exposed. The etching process may include a wet etching, a dry etching process, or a combination thereof. In one example, a wet etching process may include a chemistry including HCl, Cl2, or any suitable chemistry appropriate for the second dielectric layer 220 material. In one example, a dry etching process may include forming a photoresist layer, patterning the photoresist layer, etching the second dielectric layer 220, and removing the photoresist layer. In furtherance of the example, the dry etching process used to etch the second dielectric layer 220 may include a chemistry including fluorine-containing gas. In furtherance of the example, the chemistry of the dry etch includes CF4, SF6, or NF3.

Referring to FIG. 12, the FinFET device 200 includes a gate structure 226. The gate structure 226 traverses the fin structure 224, separating a source and drain (S/D) feature 228 of the fin structure 224. The S/D feature 228 defines a channel region therebetween and underlying the gate structure 226. The gate structure 226 may include a gate dielectric layer 230, a gate electrode 232, and gate spacers. The gate dielectric layer 230 includes a dielectric material, such as silicon oxide, high-k dielectric material, other suitable dielectric material, or combinations thereof. Examples of high-k dielectric material include HfO2, HfSiO, HfSiON, HfTaO, HfTiO, HfZrO, zirconium oxide, aluminum oxide, hafnium dioxide-alumina (HfO2-Al2O3) alloy, other suitable high-k dielectric materials, and/or combinations thereof. The gate electrode 232 includes polysilicon and/or a metal including Al, Cu, Ti, Ta, W, Mo, TaN, NiSi, CoSi, TiN, WN, TiAl, TiAlN, TaCN, TaC, TaSiN, other conductive materials, or combinations thereof. The gate structure 226 may include numerous other layers, for example, capping layers, interface layers, diffusion layers, barrier layers, or combinations thereof. A hard mask layer may be formed over the gate structure 226. The hard mask layer may include silicon oxide, silicon nitride, silicon oxynitride, silicon carbide, other suitable material, or combinations thereof.

The gate structure 226 is formed by a suitable process, including deposition, lithography patterning, and etching processes. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. The lithography patterning processes include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography exposing process is implemented or replaced by other methods, such as maskless photolithography, electron-beam writing, and ion-beam writing. In yet another alternative, the lithography patterning process could implement nanoimprint technology. The etching processes include dry etching, wet etching, and/or other etching methods.

The gate electrode 232 may be formed in a gate first or a gate last process. For example, in a gate first process, the gate structure 226 is formed and thereafter the S/D feature 228 is formed by any suitable process. For example, after forming the gate structure 226, exposed portions of the fin structure 224 material (e.g., in the S/D region) are removed while the covered portions (e.g., in the channel region) of the fin structure 224 material are not removed. Removing the exposed portions of the fin structure 224 material may include removing the fin structure 224 material thereby forming recesses in the FinFET device 200 and exposing a surface of the insulator layer 218. Alternatively, recesses are not formed and/or a surface of the insulator layer 218 is not exposed. Removing the exposed portions of the fin structure 224 may be performed by an etching process. The etching process may be a dry etching process, a wet etching process, or a combination thereof. Subsequent to the removal of the portions of the fin structure 224 material, S/D feature 228 of the fin structure 224 is epi grown in place of the removed fin structure 224 material.

As noted above, the S/D feature 228 (which is stressed) may be formed using an epitaxy process. The epitaxy process may include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition (e.g., silicon) of the fin structure 224 and/or the exposed insulator layer 218. In the present embodiment, S/D feature 228 includes type III/V semiconductor materials such as InGaAs, InP, GaSb, InAs, AlSb, InSb, and the like. Alternatively, S/D feature 228 includes Ge or any other suitable semiconductor material.

In a gate last process, similar processes/materials are used as respect to a gate first process; thus, these process/materials are not repeated herein. The difference being, however, between the gate first process and a gate last process, that a gate last process uses a dummy gate structure during the formation of the S/D feature. Thereafter, the dummy gate structure is removed and the gate final structure is formed.

In the depicted embodiment, the FinFET device 200 may be a PMOS device or an NMOS device. The S/D feature 228 may be doped during its deposition (growth) by adding n-type impurities (such as phosphorous) and p-type impurities (such as boron) to the source material of the epitaxy process or subsequent to its deposition growth process by an ion implantation process. The doped epitaxial layer may have a gradient doping profile. Subsequently, a CMP process may be performed to planarize the strained S/D feature 228. Prior to or after forming the strained S/D feature 228, implantation, diffusion, and/or annealing processes may be performed to form heavily doped S/D (HDD) features in the S/D feature 228 of the FinFET device 200, of a p-type if the FinFET device 200 is a PMOS device, or of an n-type if the FinFET device 200 is an NMOS device.

A benefit of the method 100 and FinFET device 200 is that the buffer layer 216 uses aspect ratio trapping (ART) method to trap defects (e.g., dislocations) and thereby minimize lattice mismatch and allow the insulator layer 218 to better isolate the S/D feature 228 of the fin structure 224. As such, substrate leakage of the FinFET device is lowered or even eliminated, thereby improving efficiency and carrier mobility of the FinFET device 200. Further, the method disclosed for achieving the FinFET device 200, described herein, is easily implemented into current processing. Different embodiments may have different advantages, and no particular advantage is necessarily required of any embodiment.

The FinFET device 200 may include additional features, which may be formed by subsequent processing. For example, various contacts/vias/lines and multilayer interconnect features (e.g., metal layers and interlayer dielectrics) may be formed over the substrate 210, configured to connect the various features or structures of the FinFET device 200. The additional features may provide electrical interconnection to the FinFET device 200. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Thus, provided is a semiconductor device. An exemplary semiconductor device includes a substrate includes including a first dielectric layer disposed over the substrate. The semiconductor device further includes a buffer layer disposed over the substrate and between a first and second wall of a trench of the dielectric layer. The semiconductor device further includes an insulator layer disposed over the buffer layer and between the first and second wall of the trench of the dielectric layer. The semiconductor device also includes a second dielectric layer disposed over the first dielectric layer and the insulator layer. Further, the semiconductor device includes a fin structure disposed over the insulator layer and between a first and second wall of a trench of the second dielectric layer.

In some embodiments, the semiconductor device further includes a gate structure disposed over the fin structure. The gate structure separates a source and drain region of the semiconductor device. The source and drain region define a channel region therebetween.

In some embodiments, the buffer layer is a type III/V material having a crystal structure, and the insulator layer is a type III/V material having a crystal structure. In various embodiments, the buffer layer includes a material selected from the group consisting of InP, InGaAs, and InSb, and the insulator layer includes a material selected from the group consisting of AlAsSb and InAlAs. In certain embodiments, the buffer layer includes a thickness from about 3,000 Angstroms to about 10,000 Angstroms, and the insulator layer includes a thickness from about 500 Angstroms to about 2,000 Angstroms. In some embodiments, the buffer layer is an aspect ratio trapped (ART) layer, and the insulator layer is substantially dislocation free. In various embodiments, the semiconductor device is one of a P-type metal-oxide-semiconductor (PMOS) fin-like field effect transistor (FinFET) device or a N-type metal-oxide-semiconductor (NMOS) FinFET device, and the semiconductor device is included in an integrated circuit device.

Also provided is a alternative embodiment of a semiconductor device. The exemplary semiconductor device includes a substrate and a buffer layer formed over the substrate and interposed between a first dielectric layer. The semiconductor device further includes an insulator layer formed over the buffer layer and interposed between the first dielectric layer. Further, the semiconductor device includes a fin structure formed over the insulator layer and interposed between a second dielectric layer, the second dielectric layer being formed over the first dielectric layer and over the insulator layer.

In some embodiments, the semiconductor device further includes a gate dielectric layer disposed on a central portion of the fin structure and a gate electrode disposed on the dielectric layer. The gate electrode traverses the fin structure and separates a strained source and drain feature of the semiconductor device. The strained source and drain feature define a channel region of the fin structure therebetween. The strained source and drain feature include a type III/V material. The strained source and drain feature and the channel region of the fin structure have different lattice constants. In various embodiments, the semiconductor device further includes an interface between the buffer layer and the insulator layer that is substantially dislocation free, and an interface between the insulator layer and the fin structure that is substantially dislocation free.

In some embodiments, the buffer layer includes a material having a crystal structure, and the insulator layer includes a material having a crystal structure. In various embodiments, the buffer layer includes a dielectric material, and the insulator layer includes a high band gap dielectric material.

Also provided is a method. The method includes providing a substrate and depositing a first dielectric layer on the substrate. The method further includes, forming a first trench in the first dielectric layer exposing a surface of the substrate. The method further includes depositing a buffer layer over the exposed surface of the substrate within the first trench. The method also includes recessing the buffer layer within the first trench and depositing an insulator layer over the recessed buffer layer within the first trench. The method also includes depositing a second dielectric layer over the substrate including the insulator layer. Further, the method includes forming a second trench in the second dielectric layer exposing a surface of the insulator layer. Also, the method includes forming a fin structure over the exposed surface of the insulator layer within the second trench and removing a portion of the second dielectric layer exposing sidewalls of the fin structure.

In some embodiments, the method further includes after depositing the buffer layer and before recessing the buffer layer, performing a planarizing process on the substrate including the buffer layer. The method further includes after forming the fin structure and before removing the portion of the second dielectric layer, performing a planarizing process on the substrate including the fin structure. The method further includes forming a gate structure over the fin structure including the exposed sidewalls. The gate structure separates a source and drain region of the semiconductor device. The source and drain region define a channel region therebetween. The method further includes removing the fin structure in the source and drain region, and forming a stressed source and drain feature of the fin structure in the source and drain region.

In some embodiments, removing the fin structure in the source and drain region includes forming recesses in the semiconductor device and exposing a surface of the insulator layer, and forming the stressed source and drain feature includes epitaxially (epi) growing the source and drain feature on the exposed surface of the insulator layer within the recesses. In certain embodiments, forming the gate structure includes, in a central region of the fin structure, forming a gate dielectric layer and forming a gate electrode over the gate dielectric layer. In various embodiments, depositing the buffer layer includes epi growing a type III/V material, and depositing the insulator layer includes epi growing a type III/V material. In further embodiments, depositing the buffer layer includes utilizing an aspect ratio trapping (ART) method. The ART method includes epi growing the buffer layer such that the first trench is substantially filled, and trapping dislocations of the buffer layer by laterally confining sidewalls of the buffer layer within the first trench during the epi growing process such that a top surface of the buffer layer is substantially dislocation free. In certain embodiments, depositing the insulator layer includes epi growing a dielectric material that is substantially dislocation free. In various embodiments, recessing the buffer layer includes performing a wet etching process in an apparatus, depositing the insulator layer includes epi growing a high band III/V dielectric material in the apparatus, and forming the second trench includes a two step etching process comprising: a first step including a dry etching process; and a second step including a wet etching process, the wet etching process stopping on the insulator layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a substrate
   a first dielectric layer disposed over the substrate;
   a buffer layer disposed over the substrate and between first and second walls of a trench of the dielectric layer;
   an insulator layer disposed over the buffer layer and between the first and second wall of the trench of the dielectric layer;
   a second dielectric layer disposed over the first dielectric layer and the insulator layer; and
   a fin structure disposed over the insulator layer and between first and second walls of a trench of the second dielectric layer.

2. The semiconductor device of claim 1 further comprising:
   a gate structure disposed over the fin structure, the gate structure separating source and drain regions of the semiconductor device, the source and drain regions defining a channel region therebetween.

3. The semiconductor device of claim 1 wherein the buffer layer is a type III/V material having a crystal structure, and
   wherein insulator layer is a type III/V material having a crystal structure.

4. The semiconductor device of claim 1 wherein the buffer layer includes a material selected from the group consisting of AlAs, AlAs/Ge, InP, InGaAs, InAs, and InSb, and
   wherein the insulator layer includes a material selected from the group consisting of AlAsSb, GaAsSb, and InAlAs.

5. The semiconductor device of claim 1 wherein the buffer layer includes a thickness from about 3,000 Angstroms to about 10,000 Angstroms, and
   wherein the insulator layer includes a thickness from about 500 Angstroms to about 2,000 Angstroms.

6. The semiconductor device of claim 1 wherein buffer layer is an aspect ratio trapped (ART) layer, and
   wherein the insulator layer is substantially dislocation free.

7. The semiconductor device of claim 1 wherein the semiconductor device is one of a P-type metal-oxide-semiconductor (PMOS) fin-like field effect transistor (FinFET) device or a N-type metal-oxide-semiconductor (NMOS) FinFET device, and
   wherein the semiconductor device is included in an integrated circuit device.

8. A semiconductor device comprising:
   a substrate;
   a buffer layer formed over the substrate and interposed between a first dielectric layer;
   an insulator layer formed over the buffer layer and interposed between the first dielectric layer; and
   a fin structure formed over the insulator layer and interposed between a second dielectric layer, the second dielectric layer being formed over the first dielectric layer and over the insulator layer.

9. The semiconductor device of claim 8 further comprising:
   a gate dielectric layer disposed on a central portion of the fin structure; and
   a gate electrode disposed on the dielectric layer, the gate electrode traversing the fin structure and separating a strained source and drain feature of the semiconductor device, the strained source and drain feature defining a channel region of the fin structure therebetween,
   wherein the strained source and drain feature includes a type III/V material, and
   wherein the strained source and drain feature and the channel region of the fin structure have different lattice constants.

10. The semiconductor device of claim 8 further comprising;
    an interface between the buffer layer and the insulator layer that is substantially dislocation free; and
    an interface between the insulator layer and the fin structure that is substantially dislocation free.

11. The semiconductor device of claim 8 wherein the buffer layer includes a material having a crystal structure, and
    wherein the insulator layer includes a high band gap material having a crystal structure.

12. The semiconductor device of claim 8 wherein the buffer layer includes a dielectric material, and
    wherein the insulator layer includes a high band gap dielectric material.

13. A method of manufacturing a semiconductor device, comprising:
    providing a substrate;
    depositing a first dielectric layer on the substrate;
    forming a first trench in the first dielectric layer exposing a surface of the substrate;
    depositing a buffer layer over the exposed surface of the substrate within the first trench;
    recessing the buffer layer within the first trench;
    depositing an insulator layer over the recessed buffer layer within the first trench;
    depositing a second dielectric layer over the substrate including the insulator layer;
    forming a second trench in the second dielectric layer exposing a surface of the insulator layer;
    forming a fin structure over the exposed surface of the insulator layer within the second trench; and
    removing a portion of the second dielectric layer exposing sidewalls of the fin structure.

14. The method of claim 13 further comprising:
    after depositing the buffer layer and before recessing the buffer layer, performing a planarizing process on the substrate including the buffer layer;
    after forming the fin structure and before removing the portion of the second dielectric layer, performing a planarizing process on the substrate including the fin structure;
    forming a gate structure over the fin structure including the exposed sidewalls, the gate structure separating a source and drain region of the semiconductor device, the source and drain region defining a channel region therebetween;
    removing the fin structure in the source and drain region; and forming a stressed source and drain feature of the fin structure in the source and drain region.

15. The method of claim 14 wherein removing the fin structure in the source and drain region includes forming recesses in the semiconductor device and exposing a surface of the insulator layer, and
wherein forming the stressed source and drain feature includes epitaxially (epi) growing the source and drain feature on the exposed surface of the insulator layer within the recesses.

16. The method of claim 14 wherein forming the gate structure includes, in a central region of the fin structure, forming a gate dielectric layer and forming a gate electrode over the gate dielectric layer.

17. The method of claim 13 wherein depositing the buffer layer includes epi growing a type III/V material, and
wherein depositing the insulator layer includes epi growing a type III/V material.

18. The method of claim 13 wherein depositing the buffer layer includes utilizing an aspect ratio trapping (ART) method, the ART method including:
epi growing the buffer layer such that the first trench is substantially filled, and
trapping dislocations of the buffer layer by laterally confining sidewalls of the buffer layer within the first trench during the epi growing process such that a top surface of the buffer layer is substantially dislocation free.

19. The method of claim 13 wherein depositing the insulator layer includes epi growing a dielectric material that is substantially dislocation free.

20. The method of claim 13 wherein recessing the buffer layer includes performing a wet etching process in an apparatus,
wherein depositing the insulator layer includes epi growing a high band III/V dielectric material in the apparatus, and
wherein forming the second trench includes a two step etching process comprising:
a first step including a dry etching process; and
a second step including a wet etching process, the wet etching process stopping on the insulator layer.

* * * * *